US007791375B1

(12) United States Patent
Clarke

(10) Patent No.: US 7,791,375 B1
(45) Date of Patent: Sep. 7, 2010

(54) DQS RESYNC CALIBRATION

(75) Inventor: Philip Clarke, Leatherhead (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/501,398

(22) Filed: Jul. 10, 2009

(51) Int. Cl.
H03K 19/00 (2006.01)
(52) U.S. Cl. .......................................... 326/93; 326/46
(58) Field of Classification Search ................... 326/38, 326/46, 93; 714/724
See application file for complete search history.

(56) References Cited

U.S. PATENT DOCUMENTS

| 5,848,285 | A | * | 12/1998 | Kapusta et al. ................. 712/1 |
| 6,066,961 | A | * | 5/2000 | Lee et al. ....................... 326/39 |
| 6,426,649 | B1 | * | 7/2002 | Fu et al. ........................ 326/41 |
| 6,943,581 | B1 | * | 9/2005 | Cruz et al. ..................... 326/41 |
| 7,222,036 | B1 | | 5/2007 | Thorne | |

OTHER PUBLICATIONS

U.S. Appl. No. 12/151,868, filed May 9, 2008, Wise et al.
External Memory PHY Interface Megafunction User Guide (ALTMEMPHY), Altera Corporation, Nov. 2008, relevant pp. 1.-5, 2-25, 2-26, 3-1 to 3-10, 3-23, 3-38, 3-39, 7-1 to 7-22.
Murray, Phil et al. "Challenges in Implementing DDR3 Memory Interface on PCB Systems—A Methodology for Interfacing DDR3 SDRAM DIMM to an FPGA," Altera Corporation, 2008.
Solving High-Speed Memory Interface Challenges With Low-Cost FPGAS, Lattice Semiconductor Corporation, May 2005, Hillsboro, Oregon.
Verma, Seyi, "How to implement high-speed 667 Mbps DDR2 interfaces with FPGAs," http://www.pldesignline.com/, Feb. 12, 2009, pp. 1-11.

* cited by examiner

Primary Examiner—Don P Le
(74) Attorney, Agent, or Firm—Mauriel Kapouytian & Treffert LLP; Michael Mauriel

(57) ABSTRACT

Read interface circuitry is disclosed that facilitates using a source-synchronous clock signal to calibrate the read interface. In one embodiment, configurable read interface circuitry allows a particular read path to be configured for use in calibrating a read interface of the destination device. In particular, a plurality of read paths are provided, each read path having a configurable multiplexor ("mux") coupled to a capture register of the read path such that the mux can be configured to select either an input coupled to an inverted output of the capture register or an input coupled to a prior register in the read data path. When the inverted output of the capture register is selected, a source-synchronous clock signal (e.g., DQS or delayed DQS signal) provided at the capture register's clock input results in a toggle signal at the capture register's output. In one embodiment, that toggle signal is provided to a re-sync register clocked by a re-sync clock signal. This toggle signal, together with another toggle signal generated at a toggle register coupled to the re-sync clock signal, are compared for various possible phases of the re-sync clock signal to determine a preferred phase of the re-sync clock signal. For other read paths, a mux coupled to a similar capture register is configured to select an input coupled to a prior register in the read path so that the read path can act as a path for incoming data signals (e.g., DQ signals).

21 Claims, 4 Drawing Sheets

DQS RESYNC CALIBRATION

BACKGROUND

The invention relates to the field of digital circuit timing and clocking.

When digital signals cross clock domain boundaries from a source device to a destination device they have to be captured and synchronized to match the clocking requirements of the destination device. It is sometimes necessary to adjust the phase of a destination-synchronous clock signal relative to the phase of a source-synchronous clock signal to minimize the number of destination device read errors of data provided from the source device.

SUMMARY

In some methods, a known "training" data pattern is written by the destination device to the source device and then read back from the source device by the destination device. The read of the training pattern by the destination device is then used to calibrate a clock signal of the destination device ("re-sync" clock) to maximize the accurate read of data at re-sync registers clocked by the re-sync clock signal. However, this method has the disadvantage of requiring that data be written into the source device and then read back by the destination device, which in turn can delay the read calibration process. This method has the additional disadvantage of requiring overwriting of existing memory contents of the source device. Moreover, such methods require that the write calibration process be completed first to ensure the data is written to the source device accurately.

In one embodiment of the present invention, configurable read interface circuitry allows a particular read path to be configured for use in calibrating a read interface of the destination device. In particular, a plurality of read paths are provided, each read path having a configurable multiplexor ("mux") coupled to a capture register of the read path such that the mux can be configured to select either an input coupled to an inverted output of the capture register or an input coupled to a prior register in the read data path. When the inverted output of the capture register is selected, a source-synchronous clock signal (e.g., DQS or delayed DQS signal) provided at the capture register's clock input results in a toggle signal at the capture register's output. In one embodiment, that toggle signal is provided to a re-sync register clocked by a re-sync clock signal. This toggle signal, together with another toggle signal generated at a toggle register coupled to the re-sync clock signal, are compared for various possible phases of the re-sync clock signal to determine a preferred phase of the re-sync clock signal. For other read paths, a mux coupled to a similar capture register is configured to select an input coupled to a prior register in the read path so that the read path can act as a path for incoming data signals (e.g., DQ signals). These and other embodiments are described in further detail below.

BRIEF DESCRIPTION OF THE DRAWINGS

For purposes of illustration only, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
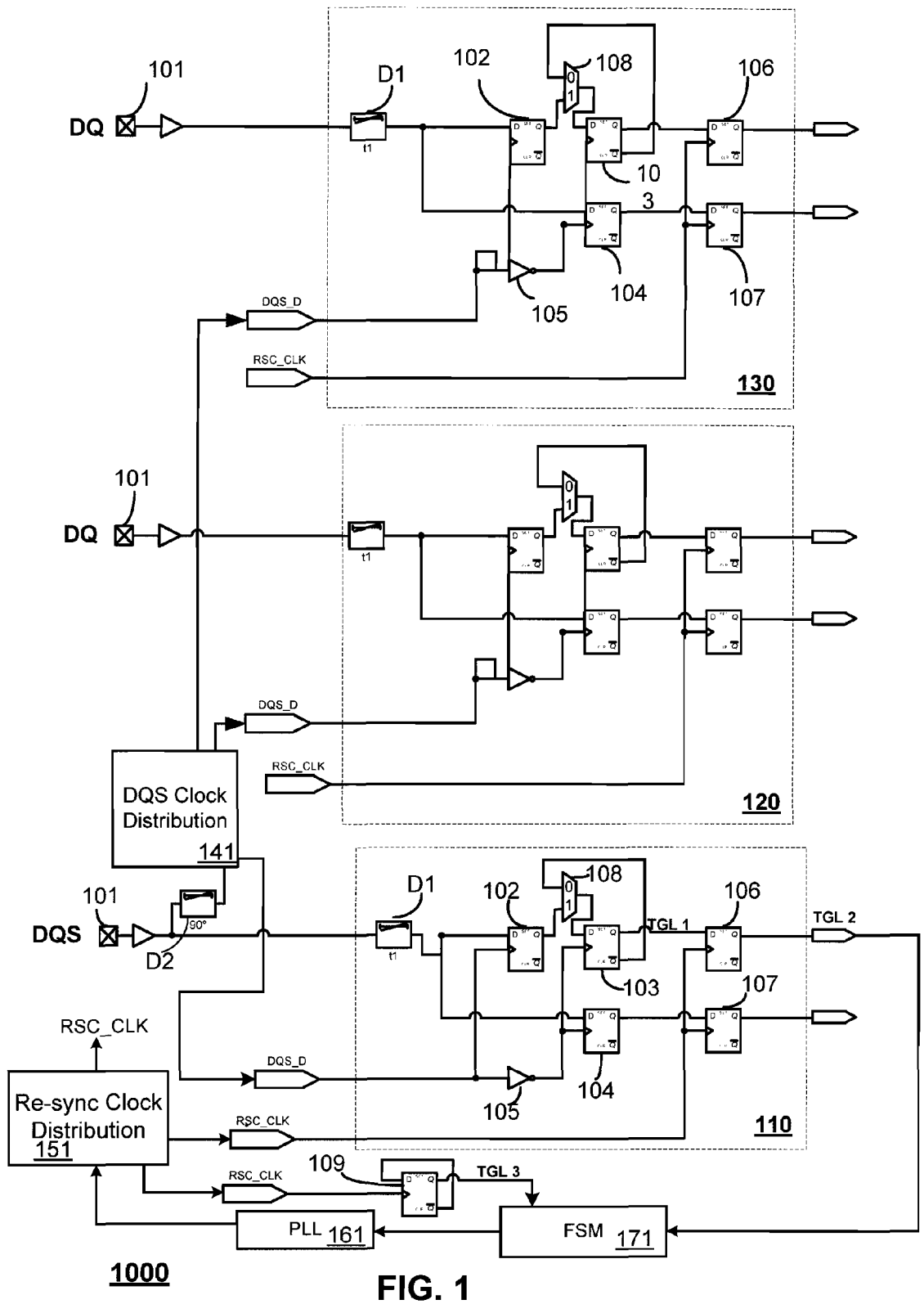
FIG. 1 illustrates read interface circuitry in accordance with an embodiment of the present invention.

FIG. 1 illustrates read interface circuitry 1000 comprising read paths 110, 120, and 130. Read paths 110, 120, and 130 are only exemplary; an entire read interface on a typical integrated circuit ("IC") device would include many more read paths. Each read path illustrated includes a delay D1, a first capture register 102, a second capture register 103, a third capture register 104, an inverter 105, a multiplexor ("mux") (sometimes spelled "multiplexer") 108, and re-sync registers 106 and 107, all elements coupled together as shown. FIG. 1 further illustrates other circuitry associated with the read interface including phase locked loop ("PLL") 161, finite state machine ("FSM") 171, re-sync clock distribution network151, delay D2, and DQS clock distribution network 141. In a preferred embodiment, the design of read paths 110, 120, 130 is such that the timing relationships of 103 to 106 & 104 to 107 match as closely as practicable and that the data output timing from registers 103,104 match closely within each read path coupled to DQS clock distribution network 141 and within each group of read paths. Many alternatives exist that do not depart from the spirit and scope of the invention. To cite just two examples: One alternative might omit or bypass delay D1; another alternative might replace inverter 105 with an additional clock distribution network that provides a clock signal that is the compliment (inverse) of the signal provided by DQS distribution network 141.

Considering the operation of read interface circuitry 1000 in further detail, in this example, each of read data paths 110, 120, and 130 are associated with a particular pin 101. The pin 101 associated with read data path 110 is selected to receive a DQS signal from a source device. The pins 101 associated with read data paths 120 and 130 are selected to receive DQ signals from the source device. In certain double data rate communication protocols, the DQ signals contain data and the DQS ("strobe") signal is the source-synchronous clock signal associated with the DQ signals (i.e., the clock signal that times the movement of data from the source device).

The DQS signal passes through delay D2 (which delays the signal by 90 degrees) and is distributed via DQS clock distribution network 141 so that each of the read data paths receives a delayed DQS signal DQS_D which is fed into the clock inputs of each capture register 102, 103, and 104. Signal RSC_CLK is a destination-synchronous clock signal originated on the destination device. RSC_CLK is fed to the clock inputs of re-sync registers 106 and 107 of each read path. One skilled in the art will appreciate that various signals referenced herein may, in alternative implementations, be differential rather than single-ended. However, for ease of explanation only, particular embodiments are illustrated and described herein using single-ended rather than differential signals.

Mux 108 in read path 110 is configured to select its "0" input while the muxes 108 in read paths 120 and 130 are configured to select their "1" inputs. This configuration allows read paths 120 and 130 to act as data paths to capture and resynchronize data from DQ signals received at the pins 101 associated with those read paths. By contrast, however, a portion of read path 110 is utilized instead to generate signals useful for the calibration of the read interface. In particular, the selection of the "0" input of the mux 108 associated with read path 110 transforms the connections associated with the capture register 103 of read path 110 so that the register generates a toggle signal TGL_1 having a frequency that is half the frequency of signal DQS_D. In the presently illustrated embodiment, this signal (TGL_1) is passed through re-sync register 106 to generate signal TGL_2, which is used in the calibration process to adjust the phase of the destination-synchronous clock signal RSC_CLK. RSC_CLK is fed into toggle register 109 to generate toggle signal TGL_3 which has a frequency half that of signal RSC_CLK. As further described in the context of FIGS. 2-3, signals TGL_3 and TGL_2 are used by FSM 171 to find a preferred phase of the destination clock signal RSC_CLK.

In the illustrated example, FSM 171 is adapted to determine the preferred phase of RSC_CLK by performing steps 306-308 of method 3000-B illustrated and discussed further below in the context of FIG. 3. In one embodiment, FSM 171 is implemented by a processor running software on the electronic device. Such an implementation imposes minimal additional cost in a system-on-a-chip ("SOC") or "system-on-a-programmable-chip" ("SOPC") type system. In other embodiments, FSM 171 can be implemented in hardware. For an example of tools adaptable for implementing an appropriate phase sweep and preferred phase selection in hardware, see the "sequencers" used in the ALTMEMPHY for DDR3 shipped as part of the Altera Quartus II™ product distribution.

Figure 2:
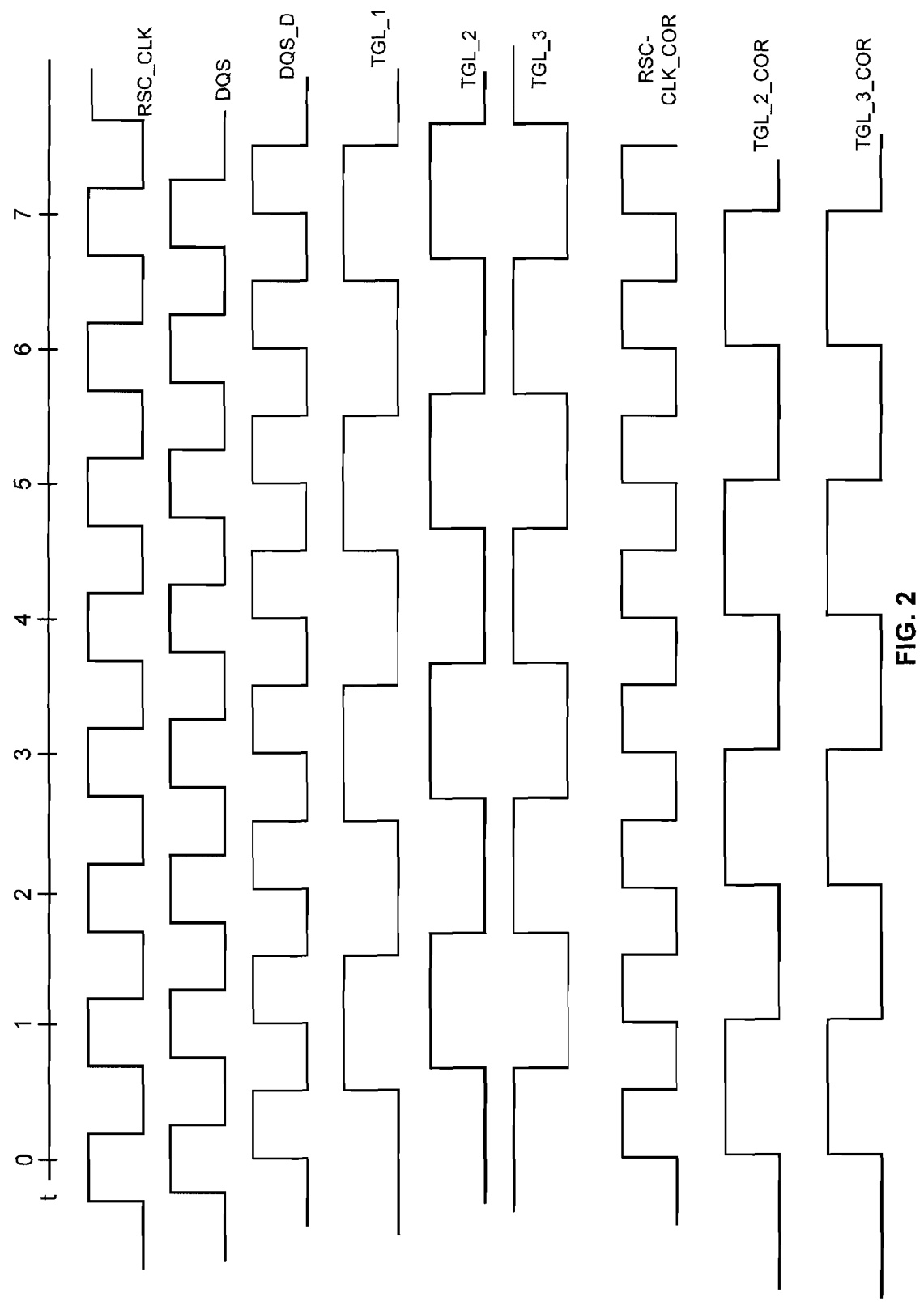
FIG. 2 illustrates the timing of various signals utilized by the read interface circuitry of FIG. 1.

FIG. 2 is a timing diagram illustrating exemplary signals associated with the operation of the embodiment of FIG. 1: In this example, RSC-CLK is a clock signal having the same frequency as that of clock signal DQS. Signal DQS_D is phase delayed by 90 degrees (90° relative to signal DQS, this is the effect of delay D2 in FIG. 1, which is inserted to provide proper capture timing at capture registers 102 and 103 in read paths 130 and 120 in FIG. 1. TGL_1 is at the output of register 103 of read path 110. TGL_1 has half the frequency of DQS_D and, as DQS_D is provided to the clock input of register 103, TGL_1 is in the DQS_D clock domain. Re-sync register 106 is clocked by re-sync clock signal RSC_CLK and thus its output signal TGL_2 is in the re-sync clock domain. TGL_3 is also in the re-sync clock domain and is the output of toggle register 109 which receives clock signal RSC_CLK at its clock input FSM 171 receives both TGL_2 and TGL_3 and uses them (as further described in the context of FIG. 3) while sweeping through possible phases of the re-sync clock to identify the re-sync clock's preferred phase. The preferred phase aligns the rising edges of the re-sync clock to the middle of the flat portions of signal TGL_1. Thus, the signal RSC-CLK_COR shows the preferred phase of the re-sync clock after the adjustment. As further explained in the context of FIG. 3, a preferred phase of the re-sync clock is selected by identifying a middle point in a largest set of consecutive phases of the re-sync clock for which the resulting observed TGL_2 and TGL_3 are in phase. Thus, TGL_2_COR and TGL_3_COR, which correspond to these observed toggle signals after RSC-CLK_COR is identified, are shown in FIG. 2 as in phase with transitions corresponding to rising edges of RSC-CLK_COR. Preferably, in this particular exemplary implementation, the resulting relationship between TGL_1 and RSC-CLK_COR maximizes the setup and hold margins at registers 106.

Figure 3:
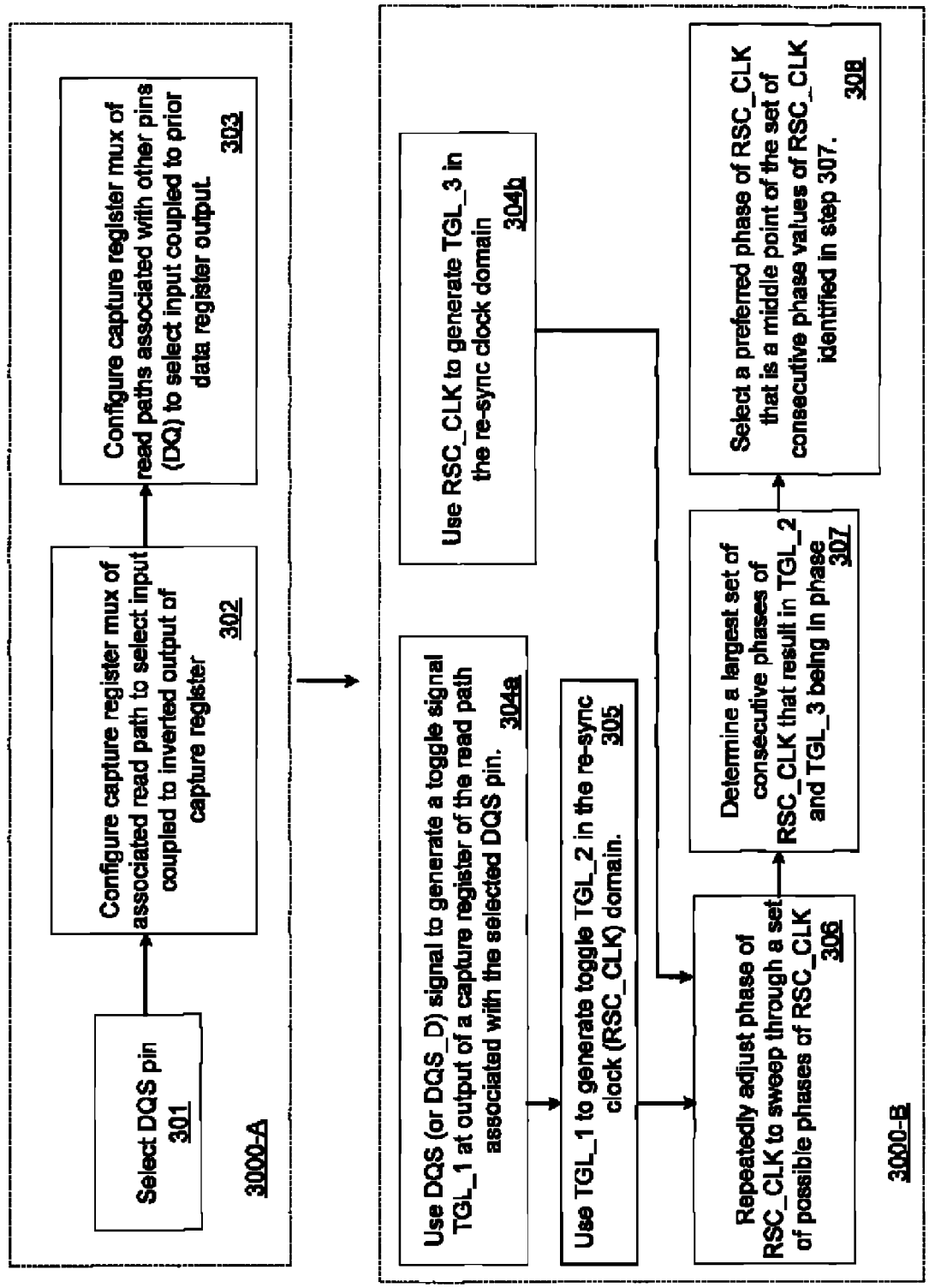
FIG. 3 illustrates methods to set up and utilize the read interface circuitry of FIG. 1 to calibrate a read interface using a source-synchronous clock signal.

FIG. 3 shows methods 3000-A and 3000-B. Steps 301-303 in method 3000-A prepare a destination device's read interface circuitry, such as that shown in FIG. 1, to be configured for calibration using the technique of steps 304-308 of method 3000-B.

Referring to method 3000-A, at step 301, a pin is selected to receive the DQS signal from a source device. At step 302, a mux connected to a capture register of a read path coupled to the selected DQS pin (e.g., mux 108 connected to capture register 103 of read path 110 shown in FIG. 1) is configured to select an input coupled to an inverted output of the capture register. At step 303, muxes connected to capture registers associated with read paths (e.g., muxes 108 connected to capture registers 103 of read paths 120 and 130 shown in FIG. 1) coupled to pins that will receive regular data signals (DQ pins) and these registers are configured to select inputs coupled to a prior data register output along the associated read path.

Referring to method 3000-B, at step 304a, a source-synchronous clock signal (e.g., DQS or DQS_D) is used to generate a toggle signal (e.g., TGL_1 in FIGS. 1 and 2) in the source-synchronous clock domain at the output of a capture register of a read path coupled to a selected DQS pin (e.g., at output of register 103 in read path 110 shown in FIG. 1). At step 304b, a destination-synchronous clock signal (e.g., RSC_CLK in FIGS. 1 and 2) is used to generate a toggle signal (e.g., TGL_3 in FIGS. 1 and 2) in the destination-synchronous (re-sync) clock domain at the output of a toggle register (e.g., toggle register 109 in FIG. 1). At step 305, the source-synchronous toggle signal (e.g., TGL_1 in FIGS. 1-2) is used to generate another re-sync clock domain toggle signal (e.g., TGL_2 in FIGS. 1-2). At step 306, the possible phases of the destination-synchronous clock signal (RSC_CLK) are swept and the resulting effects on the re-sync clock domain toggle signals (TGL_2 and TGL_3) are analyzed. Sweeping the "possible phases" may include sweeping more the 360 degrees of phases. For example, in one embodiment, 720 degrees of phases may be swept to better ensure accuracy. As one skilled in the art will appreciate, for half the possible phases of the re-sync clock (RSC_CLK) phase set, the observed toggle signals (TGL_2 and TGL_3) will be in phase and for the other half of the possible re-sync clock phase set, the two toggle signals (TGL_2 and TGL_3) will be out of phase. At step 307, the method determines the largest set of consecutive re-sync clock phases for which the corresponding two toggle signals (TGL_2 and TGL_3) are in phase. At step 308 a preferred phase of the re-sync clock (RSC_CLK) is selected that is at a middle point of the largest set of consecutive phases identified in step 307.

In alternative embodiments to that illustrated in FIGS. 1 and 3, a toggle signal in the source-synchronous (DQS or DQS_D) clock domain may be used directly for setting the phase of a re-sync clock. In such an alternative, the phase of the re-sync clock would be compared to the phase of a toggle signal such as TGL_1 illustrated in FIG. 2 and the phase of the re-sync clock would be adjusted so that it is offset by 90 degrees relative to TGL_1. Such an alternative would have some value in that it would incorporate the timing effects of the capture registers. However, use of TGL_2 and TGL_3 as described in the primary embodiment is preferred given that using TGL_2 allows the setup and hold times for re-sync registers (e.g., re-sync register 106) to be taken into account.

In another alternative, several read paths on the interface may be coupled to pins receiving DQS signals and configured like read path 110 to generate similar toggle signals. Calibration, in such alternatives, may be based on a combined toggle signal that reflects the combination of several toggle signals from respective such read paths. Such an alternative may have the advantage of taking into account some variations in read paths across several points of the interface, and thus may result in a more accurate calibration result. This type of alternative is especially useful if there are appreciable deficiencies in the matching of the register to register paths 103 to 106 and 104 to 107 within a read path or between read paths or if there are large variations in routing delays.

In the primary embodiment illustrated above, toggle signals such as TGL_1 and TGL_2 have half the frequency of the signal. However, alternative implementations may provide for further frequency division by configuring additional registers in series along a read path to further divide the DQS signal (in a manner similar to the configuration of register 103 when the "0" input of mux 108 is selected). Thus, in general, toggle signals used for calibration in alternative embodiments may have a frequency that is 1/N of the frequency of the DQS signal.

In one embodiment of a read interface in accordance with the present invention, the DQS pin and associated read path (e.g., read path 110 in FIG. 1) is only utilized for generating a toggle signal used in calibrating the re-sync clock as described above. However, in other embodiments, a read path such as read path 110 can be reconfigured to capture a DQS signal along a read data path by reconfiguring mux 108 in read path 110 to select its "1" input. This change of configuration allows read path 110 to be used for skew compensation for the interface to determine a preferred value for the delay of D2 relative to D1. Specifically, in such a configuration, the DQS signal delayed by D2 would be used as a clock signal at the clock inputs of registers 102, 103, and 104 and the DQS signal delayed by D1 would be used as a data signal at the data inputs of those registers. Those skilled in the art will appreciated that such an alternative allows for adjusting the delay of D2 and/or D1 (in implementations where D1 is utilized) to maximize the accurate capture of incoming data. For example, if the delay of D2 and/or D1 is set properly, and capture registers 102, 103, and 104 are successfully capturing the DQS signal at their data inputs, the output of registers 102 and 103 should remain at a steady high value and the output of register 104 should remain at a steady low value.

In another alternative application, configuring mux 108 of read path 110 to select its "0" input allows read path 110 to serve as a "mimic" path relative to other data read paths. Timing variations due to voltage and temperature on this path can be measured and used to adjust clock phases to maintain accurate data resynchronization for registers 106 and 107 on primary data read paths (e.g. read paths 120 and 130). This may utilize the DQS pin as shown, or an alternate pin.

Read interface circuitry 1000, shown in FIG. 1, may be implemented as part of a read interface in any IC that supports read circuitry configuration. Such configuration may be accomplished via data stored in programmable elements on the IC. Programmable elements may include dynamic or static RAM, flip-flops, electronically erasable programmable read-only memory (EEPROM) cells, flash, fuse, anti-fuse programmable connections, or other memory elements. Read interface configuration may also be accomplished via one or more externally generated signals received by the IC during operation of the IC. Data represented by such signals may or may not be stored on the IC during operation of the IC. Circuitry configuration may also be accomplished via mask programming during fabrication of the IC. While mask programming may have disadvantages relative to some of the field programmable options already listed, it may be useful in certain high volume applications.

A specific example of an IC that supports read interface configuration is a programmable logic device ("PLD"). PLDs (also referred to as complex PLDs, programmable array logic, programmable logic arrays, field PLAs, erasable PLDs, electrically erasable PLDs, logic cell arrays, field programmable gate arrays, or by other names) provide the advantages of fixed ICs with the flexibility of custom ICs. PLDs have configuration elements (i.e., programmable elements) that may be programmed or reprogrammed. Placing new data into the configuration elements programs or reprograms the PLD's logic functions and associated routing pathways.

Figure 4:
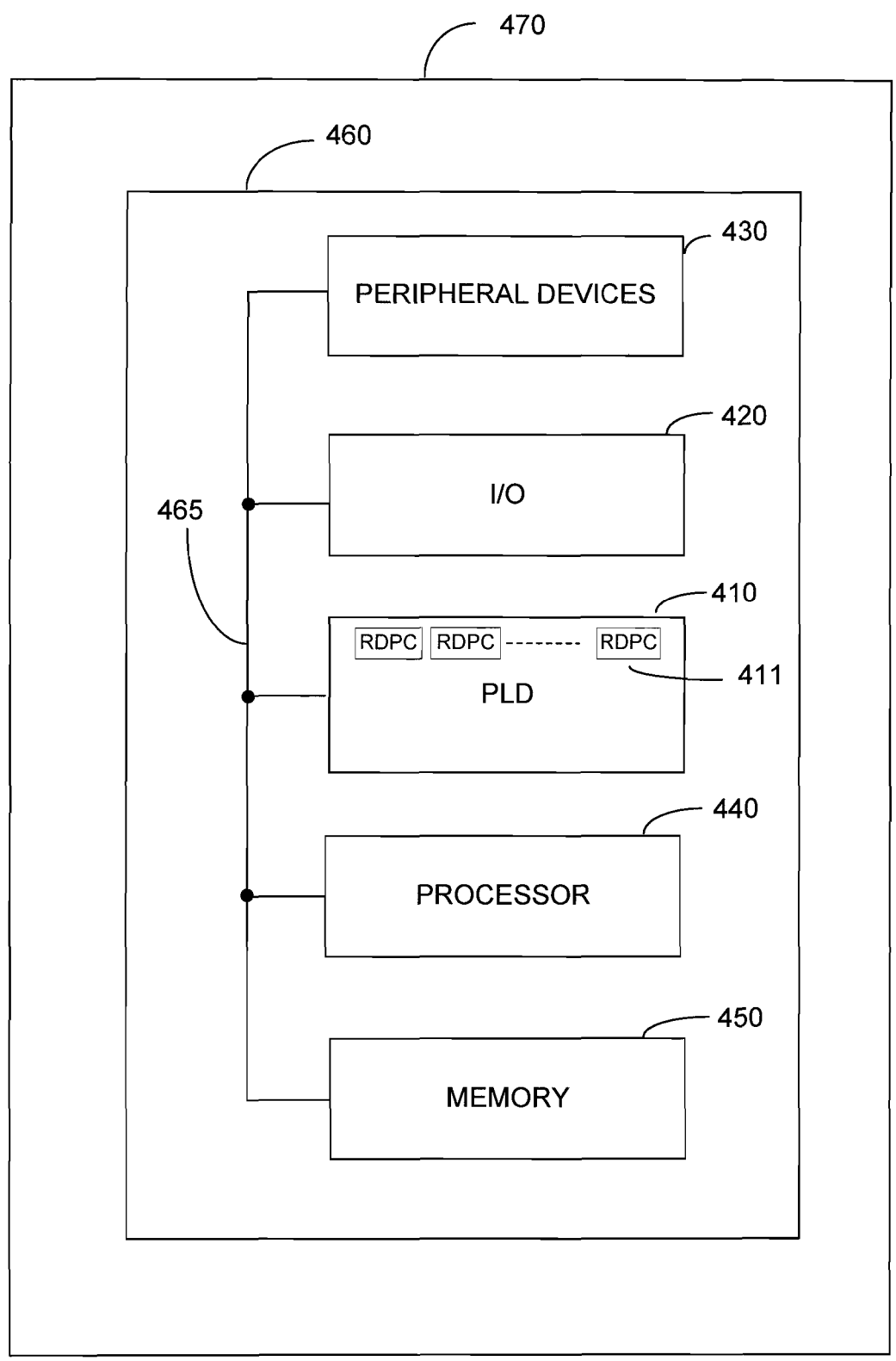
FIG. 4 illustrates a data processing system including a programmable logic device that has configurable read interface circuitry in accordance with an embodiment of the present invention.

FIG. 4 illustrates an exemplary data processing system 400 including a PLD 410. PLD 410 includes read path circuitry 411. Read path circuitry 411 includes read path circuitry in accordance with an embodiment of the present invention, such as, for example read paths 110, 120, and 130 shown in FIG. 1.

Data processing system 400 may include one or more of the following additional components: processor 440, memory 450, input/output (I/O) circuitry 420, and peripheral devices 430 and/or other components. These components are coupled together by system bus 465 and are populated on circuit board 460 which is contained in end-user system 470. A data processing system such as system 400 may include a single end-user system such as end-user system 470 or may include a plurality of systems working together as a data processing system.

System 400 can be used in a wide variety of applications, such as computer networking, data networking, instrumentation, video processing, digital signal processing, or any other application where the advantage of using programmable or reprogrammable logic in system design is desirable. PLD 410 can be used to perform a variety of different logic functions. For example, PLD 410 can be configured as a processor or controller that works in cooperation with processor 440 (or, in alternative embodiments, a PLD might itself act as the sole system processor). PLD 410 may also be used as an arbiter for arbitrating access to shared resources in system 400. In yet another example, PLD 410 can be configured as an interface between processor 440 and one of the other components in system 400. It should be noted that system 400 is only exemplary.

In one embodiment, system 400 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but only by the following claims.

What is claimed is:

1. A read interface of a destination integrated circuit ("IC") device comprising a plurality of read paths, a read path comprising:

a capture register including a clock input coupled to receive a source-synchronous clock signal derived from a clock signal provided by a source circuit device; and a multiplexer including at least a first input coupled to an inverted data output of the capture register and a second input coupled to receive input from a prior circuit element in the read path.

2. The read interface of claim 1 wherein a multiplexer of a first of the plurality of read data paths is configured to select its first input such that a data output of a capture register of the first read data path is coupled to provide a first toggle signal in a domain of the source-synchronous clock signal.

3. The read interface of claim 2 wherein a multiplexer of a second of the plurality of read data paths is configured to select its second input such that a data output of a capture register of the second data path is coupled to provide data received through the multiplexer from a prior circuit element in the data path.

4. The read interface of claim 1 wherein the capture register is a second capture register on a read path, the second input of the multiplexer being coupled to receive the output of a first capture register on the read path.

5. The read interface of claim 4 wherein the first capture register is a positive-edge triggered flip flop and the second capture register is a negative-edge triggered flip flop.

6. The read interface of claim 1 further comprising:

a re-sync register coupled to receive a destination-synchronous clock signal provided by the destination IC device and coupled to receive the first toggle signal and output a second toggle signal; and a finite state machine coupled to receive to receive the second toggle signal and to receive a third toggle signal provided by an output of a toggle register coupled to receive a destination-synchronous clock signal, wherein the finite state machine is further coupled to a phase locked loop ("PLL") and is adapted to, in communication with the PLL, sweep possible phases of the destination-synchronous clock signal and use the second and third toggle signals to determine a preferred phase for the destination-synchronous clock signal.

7. The read interface of claim 6 wherein the finite state machine is adapted to select the preferred phase by identifying a middle point in a longest consecutive series of possible phases of the destination-synchronous clock signal for which the second and third toggle signals are in phase.

8. The read interface of claim 6 wherein the finite state machine is adapted to select a preferred phase such that a rising edge of the phase-corrected destination-synchronous clock signal is substantially half-way between a rising and a falling edge of a signal at the output of the capture register.

9. A programmable logic device comprising the read interface of claim 1.

10. A method of preparing a read interface of a destination integrated circuit ("IC") device to be calibrated for communication with a source device comprising:

selecting a pin of the destination IC device to receive a source-synchronous clock signal; and configuring connections at a capture register of the destination IC device associated with the selected pin to adapt the capture register to provide, responsive to the source-synchronous clock signal, a toggle signal having a frequency that is 1/N of a frequency of the source-synchronous clock signal.

11. The method of claim 10 wherein N is 2.

12. The method of claim 10 wherein configuring is accomplished after the device is powered on for calibration.

13. The method of claim 10 wherein configuring is accomplished before the device is powered on for calibration.

14. The method of claim 10 further comprising:

selecting other pins of the destination IC device to receive a data signal from the source device; and configuring connections at capture registers of the destination IC device associated with the selected other pins to adapt those capture registers to provide, responsive to the source-synchronous clock signal and the source data signal, a signal carrying at least some data from the source device's data signal to re-sync registers of the destination IC device.

15. A method of calibrating a read interface of a destination integrated circuit ("IC") device to communicate with a source device comprising:

providing a source-synchronous clock signal to one or more capture registers of the destination IC device;

using the source-synchronous clock signal at the one or more capture registers to generate a first toggle signal responsive to the source-synchronous clock signal, the toggle signal having a frequency that is 1/N that of a frequency of the source-synchronous clock signal;

using the first toggle signal to adjust a phase of a destination-synchronous clock signal to synchronize the destination and source-synchronous clock signals.

16. The method of claim 15 wherein using the first toggle signal comprises:

passing the first toggle signal through a re-sync register clocked by the destination-synchronous clock signal to generate a second toggle signal; and sweeping through a set of possible phases of the destination-synchronous clock signal and determining, for each of the possible phases of the destination-synchronous clock signal, whether the second toggle signal is in phase or out of phase with a third toggle signal, the third toggle signal being generated from the destination-synchronous clock signal.

17. The method of claim 16 further comprising selecting a phase at which to set the destination-synchronous clock signal that is substantially near a middle point of the longest series of consecutive possible phases of the destination-synchronous clock signal for which the second and third toggle signals are in phase.

18. The method of claim 15 wherein using the first toggle signal comprises comparing a phase of the first toggle signal to a phase of the destination-synchronous clock signal and selecting a phase at which to set the destination-synchronous clock signal that is offset by 90 degrees from a phase of the first toggle signal.

19. The method of claim 15 wherein the one or more capture registers are in a first read path, the method further comprising:

providing the source-synchronous clock signal to one or more capture registers in a plurality of other read paths of the destination IC device; and using the source-synchronous clock signal at the one or more capture registers in each of the plurality of other read paths to generate respective other toggle signals responsive to the source-synchronous clock signal wherein the first toggle signal is used in combination with the respective other toggle signals to adjust the phase of the destination-synchronous clock signal to synchronize the destination and source-synchronous clock signals.

20. A method of calibrating one or more delay elements of a read interface of a destination integrated circuit ("IC") device to communicate with a source device comprising:

providing a first source-synchronous clock signal to a data input of one or more capture registers of the destination IC device;

providing a second source-synchronous clock signal to a clock input of the one or more capture registers, the second source-synchronous clock signal being derived from, and having a set phase delay relative to, the first source-synchronous clock signal; and using the output of the one or more capture registers to adjust one or more delay elements on the destination IC device so that the set phase delay has a preferred value for maximizing data capture at the one or more capture registers.

21. A data processing system comprising the programmable logic device of claim 9.

* * * * *